United States Patent [19]

Hopkins et al.

[11] Patent Number: 4,620,934

[45] Date of Patent: Nov. 4, 1986

[54] SOLUBLE FLUORINATED CYCLOALKANE SULFONATE SURFACTANT ADDITIVES FOR NH4F/HF OXIDE ETCHANT SOLUTIONS

[75] Inventors: Ronald J. Hopkins, Orchard Park; Evan G. Thomas, East Aurora; Harold J. Kieta, Buffalo, all of N.Y.

[73] Assignee: Allied Corporation, Morris Township, Morris County, N.J.

[21] Appl. No.: 733,568

[22] Filed: May 13, 1985

Related U.S. Application Data

[63] Continuation-in-part of Ser. No. 604,112, Apr. 26, 1984, Pat. No. 4,517,106.

[51] Int. Cl.⁴ .................. C09K 13/06; B44C 1/22; C03C 15/00; C03C 25/06
[52] U.S. Cl. .................. 252/79.4; 156/653; 156/657; 156/659.1; 252/142; 252/79.3
[58] Field of Search .................. 252/79.3, 79.4, 142; 156/653, 657, 659.1, 662; 134/2, 3

[56] References Cited

U.S. PATENT DOCUMENTS 3,650,960  3/1972  Strauss et al. .
4,040,897  8/1977  Blish et al. .
4,517,106  5/1985  Hopkins et al. .................. 252/79.4

FOREIGN PATENT DOCUMENTS 59-974  5/1984  Japan .................. 252/79.3

*Primary Examiner*—William A. Powell
*Attorney, Agent, or Firm*—Arthur J. Plantamura; Jay P. Friedenson

[57] ABSTRACT

Silicon dioxide etching solutions with soluble surfactant additives are provided. The improved silicon dioxide etchants are produced by adding soluble fluorinated surfactant additives to standard oxide etchants in the manufacture of integrated circuits. The surfactants found effective in accordance with the invention are referred to as fluorinated cycloalkane sulfonates and fluorinated cycloalkene sulfonates and have the general formula

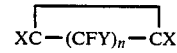

where X is F, H, Cl, OH, $SO_3A$ or R and Y is F, H, OH, R or be omitted and thereby impart a double bond; wherein R is a 1 to 4 fluoroalkyl group; and wherein n has a value of up to 6. A represents as the cation group may be $NH_4^+$, $H^+$, $Na^+$, $K^+$, $Li^+$, $R^+$ or organic amine cations.

10 Claims, No Drawings

SOLUBLE FLUORINATED CYCLOALKANE SULFONATE SURFACTANT ADDITIVES FOR NH₄F/HF OXIDE ETCHANT SOLUTIONS

BACKGROUND OF THE INVENTION

CROSS-REFERENCE TO RELATED APPLICATIONS

This application is a continuation-in-part of our co-pending application, Ser. No. 604,112, filed Apr. 26, 1984 and now U.S. Pat. No. 4,517,106.

FIELD OF THE INVENTION

This invention relates to improved compositions of etching solutions containing soluble surfactant additives. These additives are capable of maintaining reduced surface tensions for improved substrate wetting and are useful in integrated circuit manufacture. Specifically, this invention relates to the utilization of fluorinated cycloalkane sulfonates and/or fluorinated cycloalkene sulfonates as additives for suppression of surface tension.

BACKGROUND OF THE INVENTION

As integrated circuit component dimensions become smaller, physical wetting by etchant solution on substrate surfaces becomes more difficult. This is especially important for buffered oxide ammonium fluoride/hydrofluoric acid etchant solutions used in silicon dioxide etching, since these solutions exhibit extremely high surface tension values of 85 to 90 dyne/cm at typical etching temperatures. Because of the relatively low surface energies of the masking materials used, the photoresist topography, the type of impurities present, and the residual contaminants from other processing steps, it is difficult to properly wet the substrate, which results in non-uniform etching and poor line reproduction.

To overcome these problems, much of the integrated circuit industry has used one of at least two known techniques. The first involves a predip in an aqueous surfactant solution before placing the substrates in the etchant while the second utilizes direct addition of the surfactant to the etchant solution. However, as the industry progresses towards the use of more particulate free systems in which refiltration tanks are employed, and at the same time requires more precisely etched lines with less variation, existing methods have several shortcomings. With the use of predipping, two tanks are required instead of one, which adds an additional processing step. In addition, since wafers are being pre-soaked, there is a tendency to carry material over from the predip tank to the etchant tank, thus changing the etchant performance and shortening its useful life. More importantly, a major disadvantage associated with both of those methods is that, as experience has indicated, most surfactants commonly used by the industry are insoluble in ammonium fluoride/hydrofluoric acid oxide etchant solutions, which causes plating out of the surfactant onto substrate surfaces and plugs the filters (which are of the order of 0.2 micron) commonly used in recirculating etch baths and thus yields etchant solutions with little or no surfactant present. Also, the surfactants used may contain metal ion impurities which can be detrimental to integrated circuit performance or lose activity due to surfactant degradation caused by the presence of hydrofluoric acid in the etchants. Several etchant manufacturers have attempted to incorporate a surfactant in their oxide etchant solutions. However, analysis of these materials shows little, if any, surfactant is present as indicated by surface tension measurements. It is thus apparent that a need exists for an improved, effective silicon dioxide etchant solution with lower surface tension wherein the surfactant maintains surface activity in ammonium fluoride/hydrofluoric acid solutions after filtrations through 0.2 micron absolute filters and is essentially free of metal ion.

SUMMARY OF THE INVENTION

In our prior application, Ser. No. 604,112, filed on Apr. 26, 1984, which described the use of linear and highly branched fluorinated alkylsulfonates as soluble additives in buffered oxide ammonium fluoride/hydrofluoric acid etchant solutions, it has since been learned that certain fluorinated cyclic materials can provide superior wetting. Furthermore, these additives remain in solution after 0.2 filtration and are low in metallic ion contamination surface tension values of less than 30 dynes per centimeter are common for etchants with these additives compared to values of 85 to 90 dynes per centimeter for etchants without the surfactant additives.

The surfactants found effective in accordance with the invention are the fluorinated cycloalkane sulfonates and fluorinated cycloalkene sulfonates that have the general formula:

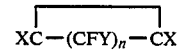

where X may be F, H, Cl, OH, SO₃A or R and Y may be F, H, OH, R or be omitted and thereby impart a double bond; wherein R is a 1 to 4 fluoroalkyl group; and wherein n has a value of up to 6. These materials have improved solubility and are not removed by 0.2 micron filtration. A as the cation group may be NH₄⁺, H⁺, Na⁺, K⁺, Li⁺, R⁺ or organic amine cations, i.e., NR₄⁺ wherein R is a 1 to 4 carbon alkyl group. Where metal ions, e.g. Na, K, and Li salts may adversely affect the electrical properties of the circuit e.g., primarily, Li, Na, K, Ca and Mg ions would be omitted. Significantly, these materials do not appear to be removed in continuous filtration baths and thus do not plug filters or plate out onto surface.

It is accordingly, an object of the present invention to provide a series of silicon dioxide etching solutions having the desirable etching rates and improved wetting over the prior art etching solutions. These improved etchants retain their surface active properties after filtration.

It is a further object of our invention to provide a series of such etching solutions which after 0.2 micron filtration are essentially free of metal ions, having the same rate of etching at the same etching temperatures as prior art solutions, and which have better wetting characteristics for improved etch uniformity, and do not leave residues or adversely affect photoresist adhesion.

These and other objects are accomplished according to our invention wherein etching solutions are provided comprising an aqueous solution of hydrogen fluoride and ammonium fluoride containing between about 1% and 12% by weight hydrogen fluoride (HF), between about 13.5% and 40.5% by weight of ammonium fluoride (NH₄F) and a small amount, i.e. in the order of 25 to 20,000 ppm of a surface active agent.

DESCRIPTION OF THE PREFERRED EMBODIMENT

The surfactants found effective in accordance with the invention are referred to as fluorinated cycloalkane sulfonates and fluorinated cycloalkene sulonates and have the general formula:

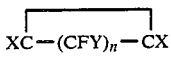

$$XC{-}(CFY)_n{-}CX$$

where X may be F, H, Cl, OH, $SO_3A$ or R and Y may be F, H, OH, R′ or be omitted and thereby impart a double bond; wherein R and R′ are a 1 to 4 fluoroalkyl group; and wherein n has a value of up to 6. The preferred compounds contain 4 to 9 carbons. These materials have improved solubility and are not removed by 0.2 micron filtration. A represents the cation group may be $NH_4^+$, $H^+$, $Na^+$, $K^+$, $Li^+$, $R''^+$ or organic amine cations, i.e., $NR''_4$, wherein R″ is a 1 to 4 carbon alkyl group. However, where salts of relatively high ion content, such as Na, K, and Li salts may adversely affect the electrical properties of the circuit compound containing such ions should be omitted. The term "low metal ion content" refers to the omission of any substantial amount of metal ions of groups I and II of the Periodic Table, primarily, Li, Na, K, Ca and Mg ions.

The new etching solutions of our invention all retain their surface active properties after 0.2 micron filtration, even under continuous filtration conditions. Moreover, the new solutions of the invention, despite being filtered, have the property of wetting substrates more effectively and yield more uniform results by etching small geometries (1 to 5 micron) and large feometries (>5 micron) of oxide in patterned resist at the same rate without adding any deleterious effects to prior art solutions.

The $NF-NF_4F$ solutions of our invention can be prepared by any method of dissolving the indicated proportions of the components in water. We prefer, however, to blend aqueous solutions of the individual components HF and $HN_4F$, respectively. We find that the standard HF solution containing about 49% hydrogen fluoride by weight is well adapted for this purpose. It will be understood that solutions of ether HF concentration may be used. Using this 49% HF solution, it is necessary to employ an ammonium fluoride solution of concentration between about 15% and about 40% $NH_4F$ by weight, by blending, solutions containing the desired relative proportions of the two components. Blends of 1 part by weight of a 49% by weight aqueous hydrogen fluoride solution and between 4 and 100 parts by volume of 15% to 48% by weight aqueous ammonium fluoride can be used. Such blends produce mixtures containing from about 1% to about 11% HF and from about 13.5% to 40.5% $NH_4F$ by weight, the remainder being water. To this is added a low metal ion version of the dissolved preferred fluorinated cycloalkane sulfonate and/or fluorinated cycloalkane sulfonate and the solution filtered through an 0.2 micron filter. Other concentrations of HF and $NH_4F$ may, of course, also be prepared.

The determined effective concentration range is 25 to 20,000 ppm added as active surfactant. It may be added as a solid or as a solution in an aqueous polar solvent mixture. The desired concentration range is from 200 to 5000 ppm active surfactant.

In some applications, a suitable diluent to lower, i.e., depress, the corrosive effect may be added. Suitable diluents include, for example, acetic, ethylene glycol, and lower alkyl alcohols, e.g., of 1 to 3 carbon atoms.

The following specific examples further illustrate the invention. It will be understood, however, that although these examples may describe in detail certain preferred operating conditions of the invention, they are given primarily for purposes of illustration and the invention in its broader aspects is not limited thereto.

EXAMPLES 1–6

To a solution 27 percent by weight of ammonium fluoride, 6 percent by weight of hydrofluoric acid and the remainder being water, was added 250 ppm surfactant. An analysis of the surfactant was preformed using $F^{19}$-NMR and mass spectrometry. Surface tensions were measured using a Du Nouy Ring tensiometer at 25° C. The solutions (as identified in Table I) were filtered through an 0.2 μm TEFLON® fluorocarbon polymer filter and were remeasured for surface tension using the same method.

The results in Table I show that the potassium salts of perfluorocyclohexyl sulfonic acid and its perfluoroethyl derivative, and of the branched perfluorooctyl sulfonic acid were not significantly removed by 0.2 μm filtration as indicated by surface tension measurements. However, the surface tension results show that the potassium salts of linear perfluorooctyl sulfonic acid was essentially removed from solution upon filtration.

As seen, the linear fluorinated sulfonates having a chain length of $C_8$ are removed, whereas the fluorinated cycloalkyl sulfonates and branched perfluoroalkylsulfonates of similar mass remain in solution.

TABLE I

| Examples | | Surface Tension Before Filtration Dynes/cm | Surface Tension After Filtration Dynes/cm |
|---|---|---|---|
| (1) | 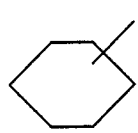 (a) | (23) | 23 |
| (2) | 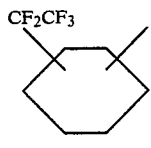 (b) | 30 | 38 |
| (3) | $C_8F_{17}SO_3K$ (Branched) | 24 | 26 |
| (4) | $C_6F_{13}SO_3Na$ | 34 | 54 |
| (5) | $C_6H_{13}SO_3Na$* | 37 | 37 |
| (6) | $C_8F_{17}SO_3K$* (Linear) | 22 | 73 |
| (7) | None* | 89 | 89 |

*(comparative)
(a) perfluorinated ring
(b) perfluorinated ring
(c) added at 1% concentration level It will be understood that various modifications may be made in the compositions described without departing from the scope of the invention and the several details disclosed as illustrative are not to be construed as placing limitations on the invention except as may be recited in the appended claims.

What is claimed:

1. An etching solution containing a surfactant, which is stable against the precipitation of the surfactant, comprising an aqueous mixture of ammonium fluoride and surfactant that contains between 13.5 and 45 weight percent ammonium fluoride (NH₄F) and between 25 and 2000 ppm of a fluorinated sulfonate selected from the group consisting of cycloalkane sulfonate, fluorinated cycloalkene sulfonate of the formula:

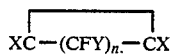

wherein n has a value of up to 6, X may be F, Cl, H, OH, SO$_3$A or R and Y may be F, Cl, H, OH, R' or be a double bond and A may be H, NH+, Na+, K+, Li+, R''+ or NR''$_4$+ wherein R'' is a 1 to 4 carbon atom alkyl and/or fluoroalkyl group and mixtures thereof and the remainder being water.

2. An etching solution according to claim 1 containing up to 11 weight percent hydrogen fluoride.

3. The etching solution of claim 1 wherein "n" in the fluorinated cyclic surfactant has a value of 2 to 4.

4. The etching solution of claim 1 wherein the fluorinated cyclic surfactant is the ammonium salt having a low metal ion content.

5. The etching solution of claim 1 wherein the fluorinated cycloalkane or cycloalkene sulfonate is fluorinated cycloalkane or cycloalkene sulfonic acid.

6. An etching solution of claim 1 wherein the fluorinated cyclo surfactant is present in smounts of 200 to 5000 ppm and is added to the etchant solution as a dry solid or as a solution in an aqueous polar solvent mixture.

7. An etching solution according to claim 1 containing up to 11 weight percent hydrogen fluoride, between 200 and 1000 ppm fluorinated cyclic surfactant diluent to lessen corrosion.

8. The etching solution of claim 2 containing up to 50 weight percent as a corrosion depressing diluent selected from the group consisting of acetic acid, ethylene glycol, and a 1 to 3 carbon atom alcohol.

9. A process for producing an etching solution which comprises blending 49% by weight aqueous hydrogen fluoride and a 15% to 40% by weight aqueous solution of ammonium fluoride, with 200 to 5000 ppm active fluorinated cyclic surfactant.

10. The process according to claim 9 wherein the aqueous ammonium fluoride contains about 30% NH₄F by weight.

* * * * *